(12) United States Patent
Howald et al.

(10) Patent No.: US 6,842,147 B2
(45) Date of Patent: Jan. 11, 2005

(54) METHOD AND APPARATUS FOR PRODUCING UNIFORM PROCESSING RATES

(75) Inventors: Arthur M. Howald, Pleasanton, CA (US); Andras Kuthi, Thousand Oaks, CA (US); Mark Henry Wilcoxson, Piedmont, CA (US); Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 64 days.

(21) Appl. No.: 10/200,833

(22) Filed: Jul. 22, 2002

(65) Prior Publication Data

US 2004/0085246 A1 May 6, 2004

(51) Int. Cl.[7] .............................................. H01Q 1/26
(52) U.S. Cl. ...................... 343/701; 343/742; 343/867; 118/723 I
(58) Field of Search ................................ 343/701, 742, 343/866, 867, 895; 118/723 I, 724, 733, 715, 719, 720

(56) References Cited

U.S. PATENT DOCUMENTS

| | | | |
|---|---|---|---|
| 5,401,350 A | | 3/1995 | Patrick et al. ............... 156/345 |
| 5,578,165 A | | 11/1996 | Patrick et al. ........... 156/643.1 |
| 5,731,565 A | | 3/1998 | Gates .................... 219/121.54 |
| 5,759,280 A | | 6/1998 | Holland et al. ........... 118/723 I |
| 5,897,712 A | * | 4/1999 | Hanawa et al. ............... 216/68 |
| 6,016,131 A | * | 1/2000 | Sato et al. .................. 343/895 |
| 6,310,577 B1 | * | 10/2001 | Ra .............................. 343/701 |
| 6,320,320 B1 | | 11/2001 | Bailey, III et al. ....... 315/111.51 |
| 6,341,574 B1 | * | 1/2002 | Bailey et al. ............. 118/723 I |
| 6,414,648 B1 | * | 7/2002 | Holland et al. ............. 343/895 |
| 6,508,198 B1 | | 1/2003 | Hoffman et al. .......... 118/723 I |
| 6,653,791 B1 | * | 11/2003 | Bailey, III et al. ...... 315/111.21 |

FOREIGN PATENT DOCUMENTS

EP          0820086 A1     1/1998     ............ H01J/37/32

OTHER PUBLICATIONS

International Search Report, dated Nov. 6, 2003.
Ansoft Corporation, Maxwell® 3D, Product Overview, http://www.ansoft.com/products/em/max3d/overview.cfm Jan. 17, 2003.
U.S. Appl. No. 10/033,807, filed Dec. 18, 2001.

* cited by examiner

Primary Examiner—Shih-Chao Chen
(74) Attorney, Agent, or Firm—Beyer Weaver & Thomas, LLP

(57) ABSTRACT

An antenna arrangement for generating an rf field distribution at a plasma generating region inside a chamber wall of a process chamber of a plasma processing apparatus is described. The antenna arrangement includes an rf inductive antenna to which an rf power supply can be connected to supply an rf current to generate a first rf field extending into the plasma generating region. A passive antenna is also provided which is inductively coupled to the rf inductive antenna and configured to generate a second rf field modifying the first rf field. The rf field distribution at the plasma generating region increases the processing uniformity of the processing apparatus compared to that in the absence of the passive antenna.

25 Claims, 11 Drawing Sheets

FIG. 8
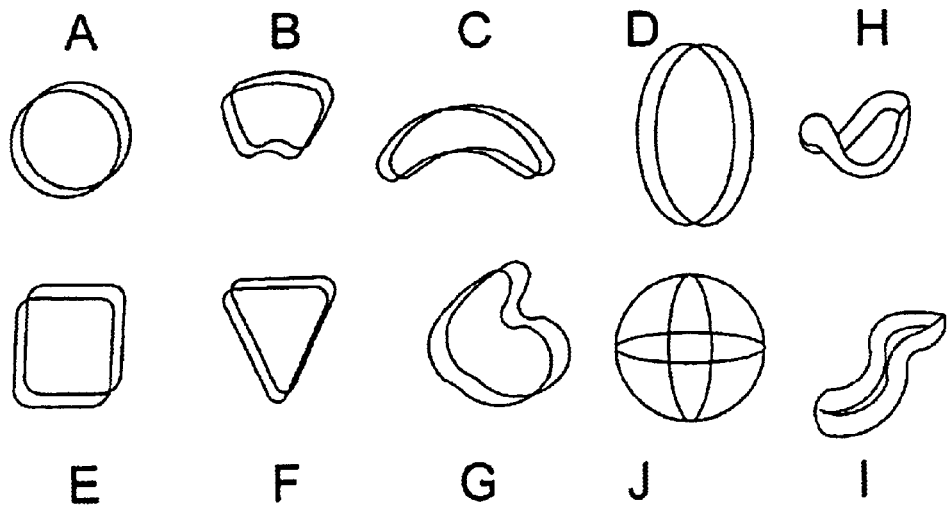
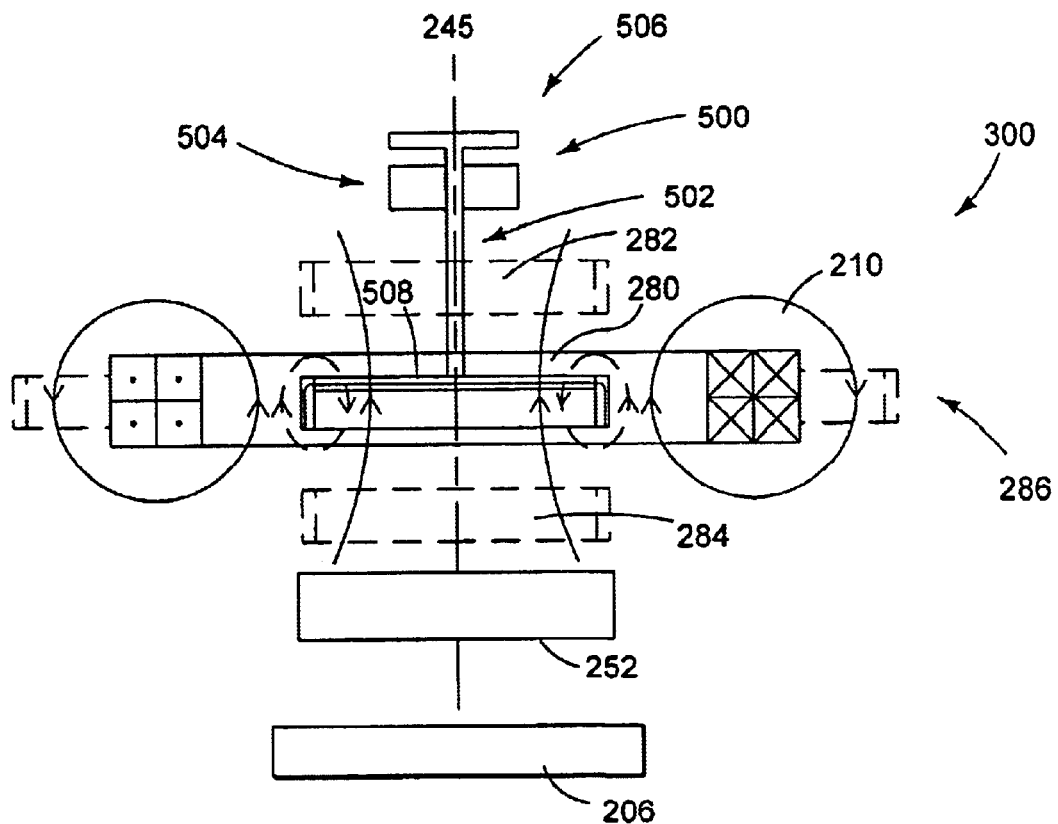
FIG. 9

METHOD AND APPARATUS FOR PRODUCING UNIFORM PROCESSING RATES

BACKGROUND OF THE INVENTION

The present invention relates generally to apparatus and methods for processing substrates, including semiconductor substrates for use in IC fabrication or glass panels for use in flat panel display applications. More particularly, the present invention relates to improved plasma processing systems that are capable of processing substrates with a high degree of processing uniformity across the substrate surface.

Plasma processing systems have been around for some time. Over the years, plasma processing systems utilizing inductively coupled plasma sources, electron cyclotron resonance (ECR) sources, capacitive sources, and the like, have been introduced and employed to various degrees to process various items such as semiconductor substrates and glass panels.

During processing, multiple deposition and/or etching steps are typically employed. During deposition, materials are deposited onto a substrate surface (such as the surface of a glass panel or a wafer). For example, deposited layers such as various forms of silicon, silicon dioxide, silicon nitride, metals and the like may be formed on the surface of the substrate. Conversely, etching may be employed to selectively remove materials from predefined areas on the substrate surface. For example, etched features such as vias, contacts, or trenches may be formed in the layers of the substrate.

One particular method of plasma processing uses an inductive source to generate the plasma. FIG. 1 illustrates a prior art inductive plasma processing reactor 200 that is used for plasma processing. A typical inductive plasma processing reactor includes a chamber 202 with an antenna or inductive coil 210 disposed above a dielectric window 212. Typically, antenna 210 is operatively coupled to a first radio frequency (rf) power source 214. Furthermore, a gas port 215 is provided within the walls 208 of the chamber 202 that is arranged for releasing gaseous source materials, e.g., the etchant source gases, into the rf-induced plasma region 204 between dielectric window 212 and a substrate 206. Substrate 206 is introduced into chamber 202 and disposed on a chuck 216, which generally acts as an electrode and is operatively coupled to a second rf power source 218.

In order to create a plasma, a process gas is input into chamber 202 through gas port 215. Power is then supplied to inductive coil 210 using first rf power source 214. The supplied rf energy couples into the chamber 202 through the dielectric window 212 and an rf magnetic field and concomitant large electric field is induced inside chamber 202. The electric field accelerates the small number of electrons present inside the chamber, inducing a circulating current in the chamber, and the circulating electrons collide with the gas molecules of the process gas. These collisions result in ionization and initiation of a discharge or plasma 204. As is well known in the art, the neutral gas molecules of the process gas when subjected to these strong electric fields lose electrons, and leave behind positively charged ions. As a result, positively charged ions, negatively charged electrons and neutral gas molecules (and/or atoms) are contained inside the plasma 204. As soon as the creation rate of free electrons exceeds their loss rate, the plasma ignites.

In the application and claims, the electromagnetic field generated by an rf inductive antenna is an rf electromagnetic field. Although in the drawings the electromagnetic fields may appear to be static, the electromagnetic fields generated by the rf inductive antenna is generally an rf electromagnetic field.

Once the plasma has been formed, neutral gas molecules inside the plasma tend to be directed towards the surface of the substrate. By way of example, one of the mechanism contributing to the presence of the neutrals gas molecules at the substrate may be diffusion (i.e., the random movement of molecules inside the chamber). Thus, a layer of neutral species (e.g., neutral gas molecules) may typically be found along the surface of substrate 206. Correspondingly, when bottom electrode 216 is powered, ions tend to accelerate towards the substrate where they, in combination with neutral species, activate the etching reaction.

One problem that has been encountered with inductive plasma systems, such as the one mentioned above, has been variations in the etch performance across the substrate, e.g., a non-uniform etch rate. That is, one area of the substrate gets etched differently than another area. As a result, it is extremely difficult to control the parameters associated with a work piece, e.g., critical dimensions, aspect ratios, and the like in the case of integrated circuits. Additionally, a non-uniform etch rate may lead to device failure in the semiconductor circuit, which typically translates into higher costs for the manufacturer. Moreover, there also exist other issues of concern such as the overall etch rate, etch profile, micro-loading, selectivity, and the like.

In recent years, it has been found that one factor in these non-uniform etch rates may be the result of variations in the plasma density across the surface of the substrate, i.e., a plasma that has regions with greater or lesser amounts of reactive species (e.g., positively charged ions). While not wishing to be bound by theory, it is believed that the variations in plasma density are created by asymmetries that are found in the magnetic and electric fields in the plasma region. If the magnetic field in the plasma region is asymmetric, it stands to reason that the circulating current of the induced electric field will be asymmetric, and therefore the ionization and initiation of the plasma will be asymmetric, and variations in the plasma density will be encountered.

The example antenna 210 shown in FIG. 1 is designed to reduce asymmetric power coupling. The antenna 210 includes two pairs of concentric planar antennas and has a complex cross over structure where the antenna elements are connected and at which rf power feeds are connected. However, the requirement of providing rf power feeds means that the antenna cannot be perfectly azimuthally symmetric. Even in the absence of rf power feeds, at the rf frequencies typically used in plasma processing, the antenna elements behave more like a transmission line, rather than as a lumped component, and so there tend to be variations in the current strength around the antenna resulting in azimuthal asymmetries in the magnetic field pattern generated Other antenna configurations have been proposed in order to improve the symmetry of the electromagnetic field in the plasma region and therefore the plasma uniformity. U.S. Pat. No. 5,729,280 (Holland et al.) describes an antenna with a particular spiral structure so as to try and average out regions of relatively higher and lower current owing to transmission line effects. A number of approaches use multiple actively powered antennae. U.S. Pat. No. 5,401,350 (Patrick, et al.) describes a coil configuration including a first spiral coil attached to a first rf supply by a first matching network and a second spiral coil, within the first coil, connected to a second rf supply by a second matching network. U.S. Pat.

No. 5,731,565 (Gates) describes a coiled antenna connected to a supply, in which a central coiled part of the antenna can be selectively connected into the antenna.

Even if the antenna could be made to generate a perfectly symmetric electromagnetic field, departures from perfect right circular cylindrical symmetry of the processing chamber or any of the elements in the processing chamber would introduce asymmetries in the rf field at the plasma processing region. For example any misalignment from cylindrical symmetry of the chuck 216, workpiece 206, chamber housing, window 212 or antenna 210 would introduce some asymmetry into the plasma processing system. Normal manufacturing tolerances will also mean that some of the parts of the plasma processing system will not be perfectly cylindrically symmetric. For example variations in the thickness of the walls of the plasma chamber could affect the symmetry of the rf field at the plasma generating region. Even if the rf field at the plasma region can be made perfectly symmetric, if the wafer is not correctly aligned, or if there are variations in the rf field distribution between the plasma generating region and the surface of the work piece, non-uniformities in plasma processing of the workpiece will arise.

Therefore, irrespective of improvements in the symmetry of the electromagnetic field generated by the antenna, there will still likely be significant non-uniformity in the plasma processing over the wafer surface, and even a perfectly symmetric electromagnetic field distribution in the plasma chamber will not guarantee perfectly uniform etching of a wafer.

In view of the foregoing, there are desired improved methods and apparatuses for improving the uniformity of processing at the surface of the substrate. As processes move toward smaller sizes, e.g., 0.1 $\mu$m sizes are currently required, proportionally precise improvements in the uniformity of the etch rate are still desirable.

SUMMARY OF THE INVENTION

According to a first aspect of the invention, there is provided an antenna arrangement for generating an rf field distribution in a plasma processing apparatus. The arrangement includes an rf inductive antenna to which an rf power supply can be connected to supply an rf current to generate a first rf field. The rf field can extend into a plasma generating region. A passive antenna is inductively coupled to the rf inductive antenna. The passive antenna is configured to generate a second rf field. The second rf field modifies the first rf field such that the rf field distribution in the plasma chamber increases the processing uniformity of the processing apparatus.

According to a further aspect of the invention, there is provided an antenna arrangement for generating an rf field distribution at a plasma region in a plasma processing device. The arrangement includes an rf inductive antenna and a passive antenna. The passive antenna is inductively coupled to the rf inductive antenna and is configured to generate an rf field which modifies the radial distribution of the rf field distribution. A device is provided for moving the passive antenna to alter the radial distribution of the rf field distribution.

According to a further aspect of the invention there is provided a method for improving plasma processing uniformity in a plasma processing device. An antenna arrangement generates an rf field distribution inside the plasma processing device, and includes an rf inductive antenna connected to an rf power supply to supply an rf current to generate a first rf field extending into the plasma generating region and a passive antenna configured to generate a second rf field. The method comprises the steps of inductively coupling the passive antenna and the rf inductive antenna. The passive antenna is positioned to cause the second rf field to modify the first rf field such that the rf field distribution in the plasma processing device increases the processing uniformity of the processing device.

According to a further aspect of the invention there is provided a method for tuning the rf field distribution of an rf antenna for use in a plasma processing device. The rf field distribution of the rf antenna is determined. At least one passive antenna is provided, inductively coupled to the rf antenna. The effect of the passive antenna on the rf field distribution is then determined.

BRIEF DESCRIPTION OF THE DRAWINGS

The invention, together with further advantages thereof, may best be understood by reference to the following description taken in conjunction with the accompanying drawings in which:

FIGS. 8A to J show example alternate shapes of the passive antenna of the arrangement;

FIG. 9 shows a schematic cross sectional diagram of an embodiment of the antenna arrangement for altering the radial distribution of the electromagnetic field at the plasma region;

In the Figures, like reference numerals refer to like components and elements.

DETAILED DESCRIPTION OF THE INVENTION

Figure 1:
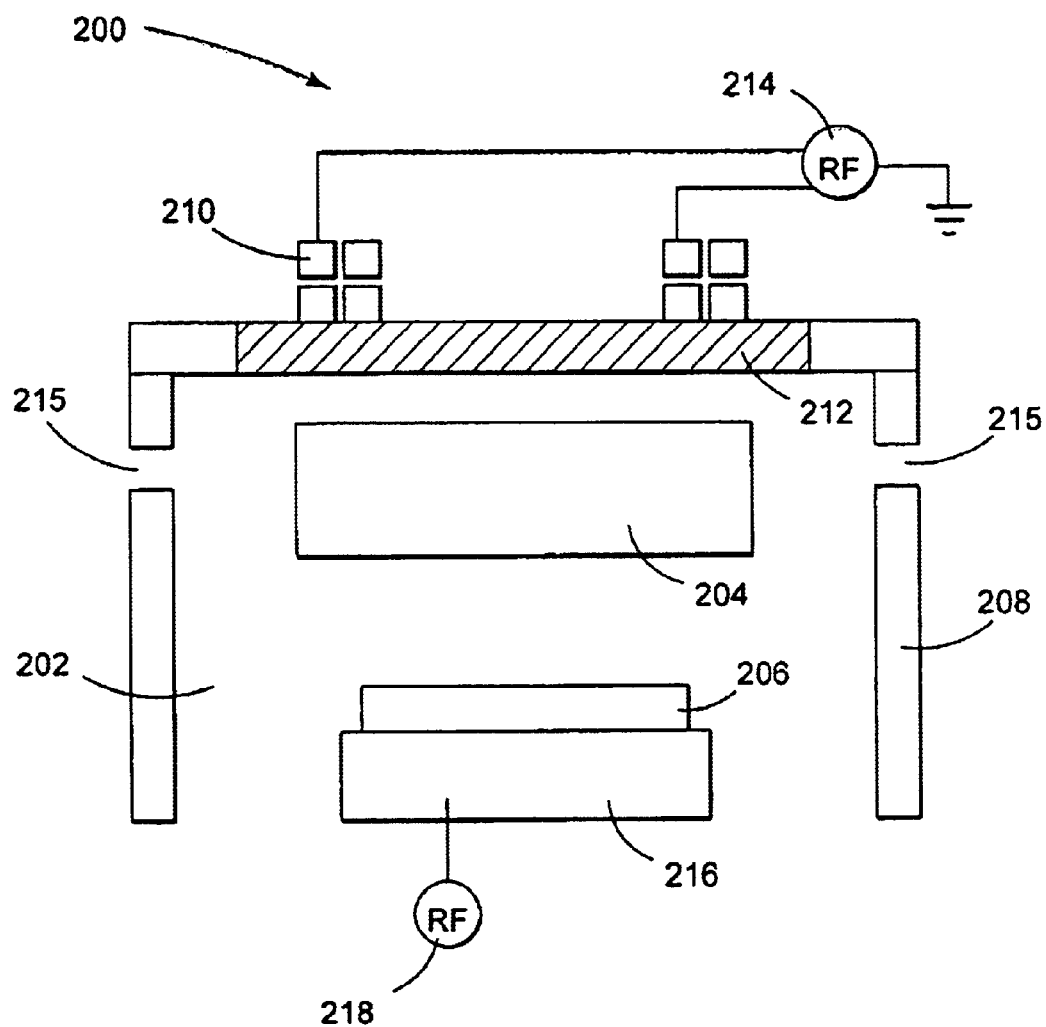
FIG. 1 shows a schematic cross sectional drawing of a plasma processing device including a prior art rf inductive antenna.

The present invention relates to methods and apparatus for increasing processing uniformity across a workpiece in a plasma processing device or tool. FIG. 1 shows a prior art plasma processing device as discussed above. The device includes an inductive rf antenna 210 connected to an rf power supply which provides a source of rf current to the antenna. In simple terms, the rf antenna generates an rf electromagnetic field distribution in a plasma processing region in the processing chamber 202 which ignites and sustains a plasma 204.

There is an rf voltage on the rf antenna and an rf current in the rf antenna. The rf voltage varies along the length of the antenna and the largest voltage difference is typically from one end (i.e. terminal) to the other end (i.e. terminal). The largest voltage difference can typically be of order several thousand volts. Both the rf voltage on the rf antenna and the rf current in the rf antenna can affect the plasma.

The rf voltage on the rf antenna directly produces an electric field in the plasma. The coupling to the plasma of the rf voltage on the antenna is typically referred to as capacitive coupling. The rf current in the rf antenna produces an rf magnetic field in the plasma which induces an rf electric field in the plasma. The coupling to the plasma of the rf current in the rf antenna is typically referred to as inductive coupling. Therefore there can be both rf inductive coupling and rf capacitive coupling between the rf antenna and plasma. In the following the term "rf field distribution" will, unless the context indicates otherwise, be used to refer to an rf electromagnetic field distribution having an inductive (i.e. magnetic) part and a capacitive (i.e. electric) part.

For an inductive plasma source, the amount of power coupled to the plasma from the antenna by inductive coupling is greater than the amount of power coupled to the plasma by the capacitive coupling. Even for an inductive rf antenna, the effect of capacitive coupling can be important. The plasma is initiated by the capacitive coupling and then sustained by the inductive coupling. Also, as the rf voltage varies along the length of the rf antenna, the capacitive coupling from the antenna to the plasma varies from different parts of the antenna. The variation in capacitive coupling can be seen in visible patterns that can be etched into the bottom surface of the dielectric window by plasma ions which sputter material from the window at regions where the capacitive coupling is strongest.

Some plasma processing systems have used Faraday shields to reduce the capacitive coupling of an inductive antenna to the plasma. Such a Faraday shield is a large flat metal disc, having a plurality of radial slots, and which is located between the inductive antenna and dielectric window. If the Faraday shield is at an rf potential of zero volts, then there will be no capacitive coupling to the plasma. If the Faraday shield is at a uniform non-zero rf potential, then the capacitive coupling to the plasma will be uniform. Radial slots are provided in Faraday shields to prevent rf currents being induced by the rf antenna which would otherwise block the inductive coupling of the rf antenna and plasma. Even in the absence of any capacitive coupling, the rf field distribution in the chamber will still have some rf electric part as a result of the rf magnetic part.

Figure 2:
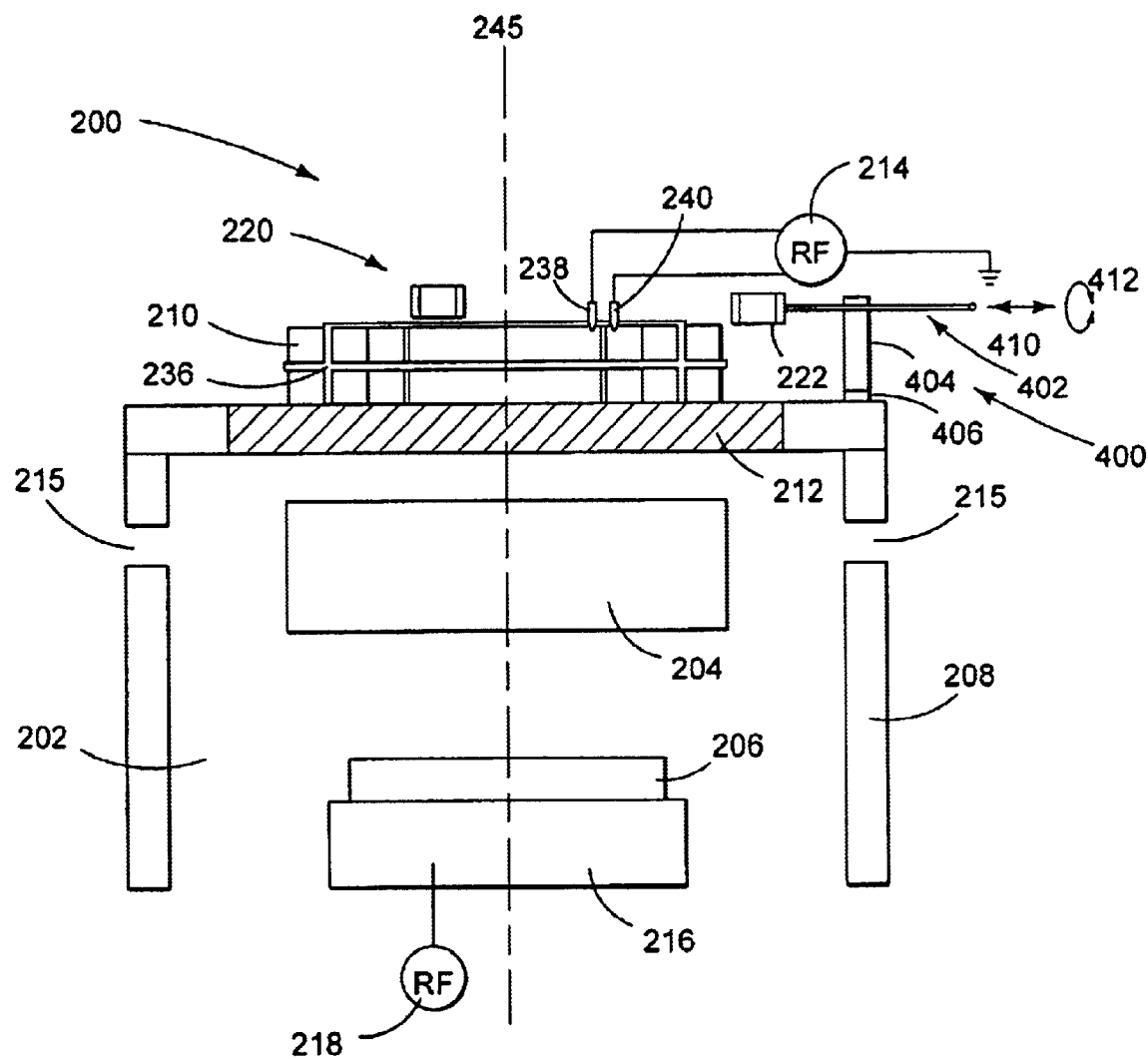
FIG. 2 shows a schematic cross sectional drawing of a plasma processing device similar to that of FIG. 1 and including an antenna arrangement according to the present invention.
Figure 3:
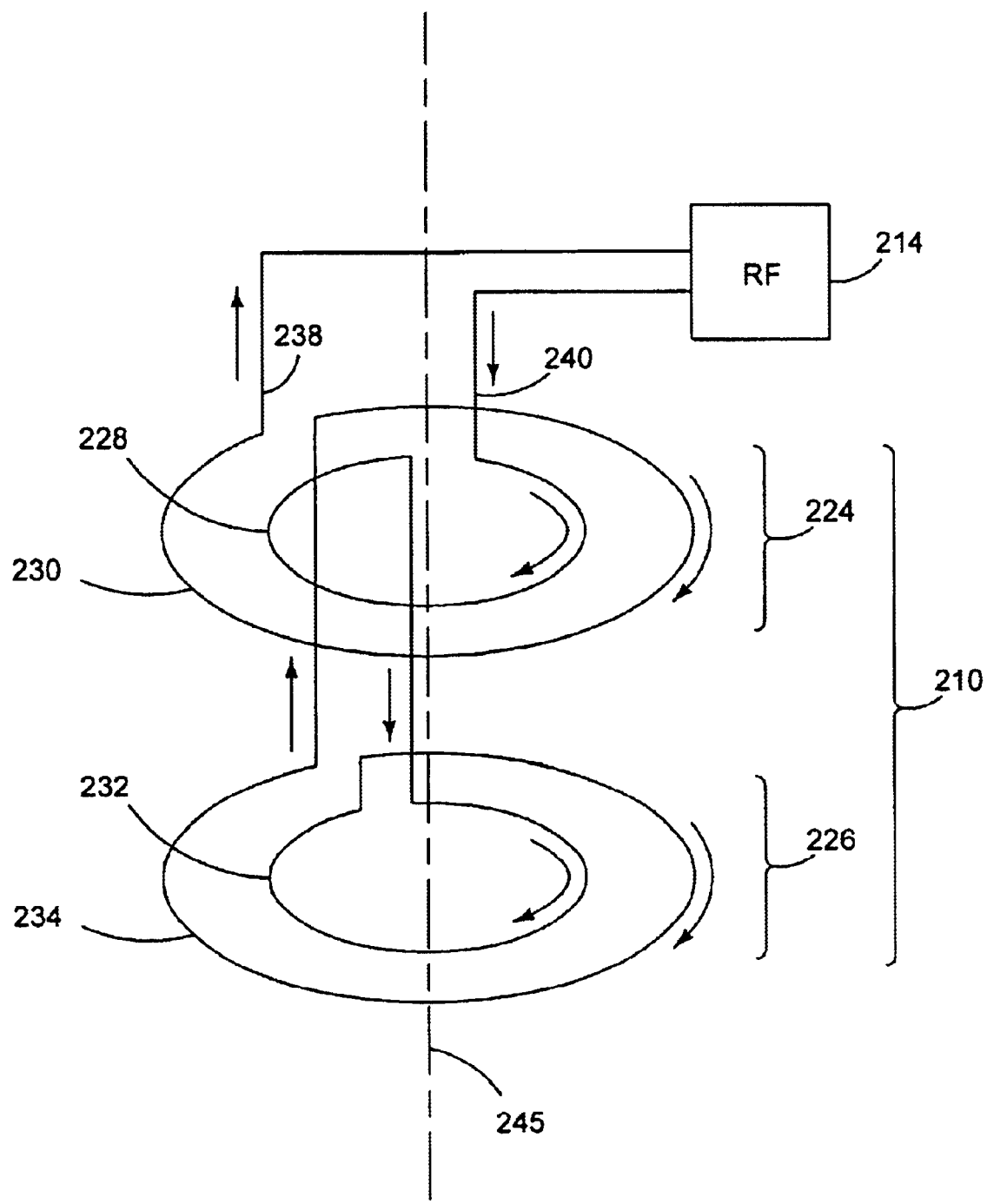
FIG. 3 shows a schematic circuit diagram illustrating the current path for the rf inductive antenna.
Figure 4:
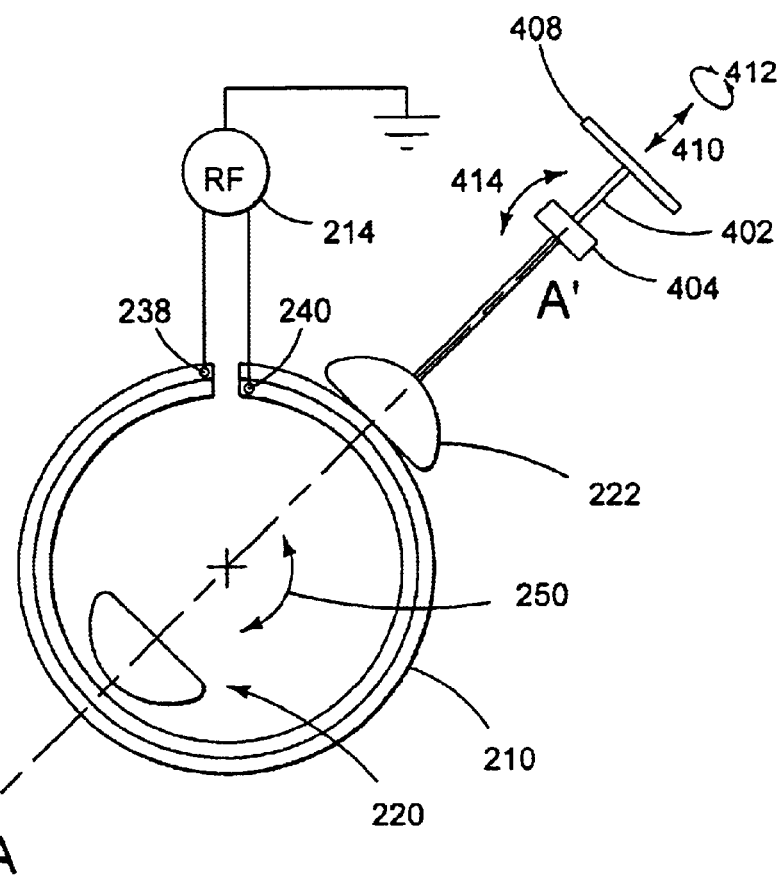
FIG. 4 shows a schematic plan view of the antenna arrangement of FIG. 2.

FIG. 2 shows a schematic cross sectional diagram of a plasma processing device like that shown in FIG. 1 but including an embodiment of an antenna arrangement according to present invention. The antenna arrangement includes inductive rf antenna 210 and a first passive antenna 220 and second passive antenna 222. FIG. 3 shows a schematic circuit diagram illustrating the current path for the inductive antenna and FIG. 4 shows a schematic plan diagram illustrating the positioning of the passive antennae relative to the inductive antenna. FIG. 2 shows the cross section along line AA' of FIG. 4.

The inductive antenna 210 comprises a first, upper pair 224 of circular antenna elements and a second, lower pair 226 of circular antenna elements. The upper pair comprises an inner loop antenna element 228 and an outer loop antenna element 230. The lower pair also comprises an inner loop antenna element 232 and an outer loop antenna element 234. The upper and lower pair are concentric about a central axis 245 extending substantially perpendicularly to the plane of the antenna. The central axis is co-linear with an axis of substantially cylindrical symmetry of the plasma chamber itself 202.

Each antenna element is made of approximately ⅜" (0.9 cm) square cross section silver plated copper. The inductive antenna has an inner diameter of approximately 6" (14.5 cm) and an outer diameter of approximately 8" (19.4 cm). The antenna elements are mounted on a circular, cruciform cross section support 236 made of PTFE, available under the trade name Teflon. The dimensions of the support are sufficient to prevent arcing between the antenna elements. The support serves to hold the antenna elements in the correct relative spatial position and also helps to prevent the antenna elements from being repelled apart under magnetic forces during operation.

As illustrated in FIG. 3, the antenna elements are connected at their free ends to provide a single current path such that the current flows in the same sense within the plane of the antenna. rf current feeds 238 and 240 are provided at the free ends of the antenna 210 by which the rf power supply 214 supplies rf current to the antenna during operation. As the inductive antenna is connected to the rf power source such that rf currents flow in the antenna it can be considered an active antenna. The rf current feeds are a source of azimuthal asymmetry in the predominantly symmetric electromagnetic field pattern that the antenna will generate. In general, not all rf antennae are designed to be azimuthally symmetric. The details of the construction of the rf inductive antenna 210 are presented in greater detail in U.S. patent application Ser. No. 10/033,807, filed on Dec. 18, 2001, entitled "Method and Apparatus For Producing Uniform Process Rates, by Wilcoxson et al., the contents of which are hereby incorporated by reference.

The invention is not limited to the example rf antenna shown in the figures. The invention can be practiced using any rf inductive antenna configuration. For example alternative rf inductive antennae can have a single or multiple spiral antenna elements, wound as flat spirals or wound to lie on the surface of a hemisphere. In such alternative embodiments of the rf antenna, an air gap between adjacent coils of the spiral can be used to prevent arcing between parts of the antenna.

As shown in FIGS. 2 and 4, passive antenna 222 is mounted on a support 400. The support 400 includes an arm 402 which is journaled in a support body 404 which is pivotally mounted by a support foot 406 on the plasma chamber. The arm has a handle 408 at a first end and the passive antenna is attached at the other end. The support allows the position and orientation of the passive antenna to be adjusted with respect to the inductive antenna. The passive antenna can be translated 410 along the axis of the arm, rotated 412 about the axis of the arm, and the support body 404 can be rotated 414. The position of either or each passive antenna may be altered in any way as required. For example, the passive antennae may be translated, rotated, tilted or otherwise oriented in three-dimensions with respect to the rf antenna.

In practice, each of the passive antennae is held in place by a support structure connecting the passive antenna to a part of the plasma processing device. A support for the second passive antenna is not shown for the sake of clarity. The supports can serve to alter the position and orientation of the passive antennae, retain the passive antennae in a preferred position and also to prevent magnetic forces from moving the passive antennae. Alternatively, the passive antennae can be placed on ancillary parts of the plasma chamber, such as a window temperature controlling device, which provides a support for the antenna.

FIG. 4 shows a schematic plan view of the antenna arrangement of the present invention. The first passive antenna 220 and the second passive antenna 222 each has a 'D' shape and is made from an approximately 1" (2.4 cm) wide band of silver plated copper. The passive antennae can be made of any electrically conducting material, but preferably are a metal and have as high a conductivity as possible. Taking the gap in the rf inductive antenna at the antenna feed point as 12 o'clock, the second passive antenna 222 is positioned at an angular position corresponding to approximately 1 o'clock and outside the periphery of the inductive antenna. The second passive antenna 220 is positioned at an angular position corresponding to approximately 7 o'clock and within the periphery of the inductive antenna. Both the passive antennae are positioned slightly above the upper surface of the inductive antenna, and within a plane substantially parallel to the plane of the inductive antenna.

Having described the configuration and structure of the antenna arrangement, the operation of the antenna arrangement will now be described with particular reference to FIGS. 5, 6, and 7. For the sake of clarity 'azimuthal' is used to refer to angular displacement about the central axis 245 of the plasma processing device as illustrated by line 250 in FIG. 4.

Figure 5:
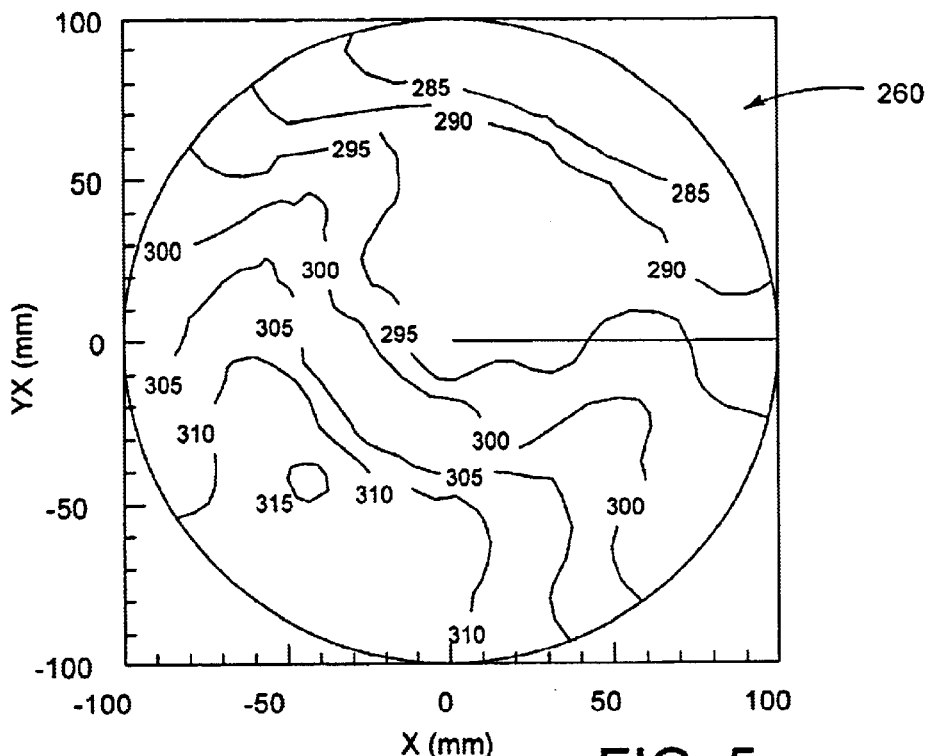
FIG. 5 shows a contour plot illustrating the effect on etch rate uniformity of asymmetries in the electromagnetic field distribution.

FIG. 5 shows a contour plot 260 of the etch rate as a function of position over the surface of a wafer processed using a prior art plasma processing device similar to that shown in FIG. 1. The top center of the plot corresponds to the position of the RF antenna feed, and the center of the plot corresponds to the central axis 245 of the plasma processing device. The contour labels indicate the etch rate in units of Angstroms per minute. As can be seen, the etch rate is the highest in a sector toward the bottom left of the plot and the lowest in a sector toward the top right of the plot. Hence, there is a gradient in etch rate across the wafer. Also the etch rate is different in different directions around the wafer, therefore there is an azimuthal asymmetry in the etch rate over the wafer. The mean etch rate over the surface of the wafer is 29.9 nm/min, with a standard deviation of 1.0 nm/min and a range of 3.5 nm/min.

Figure 6:
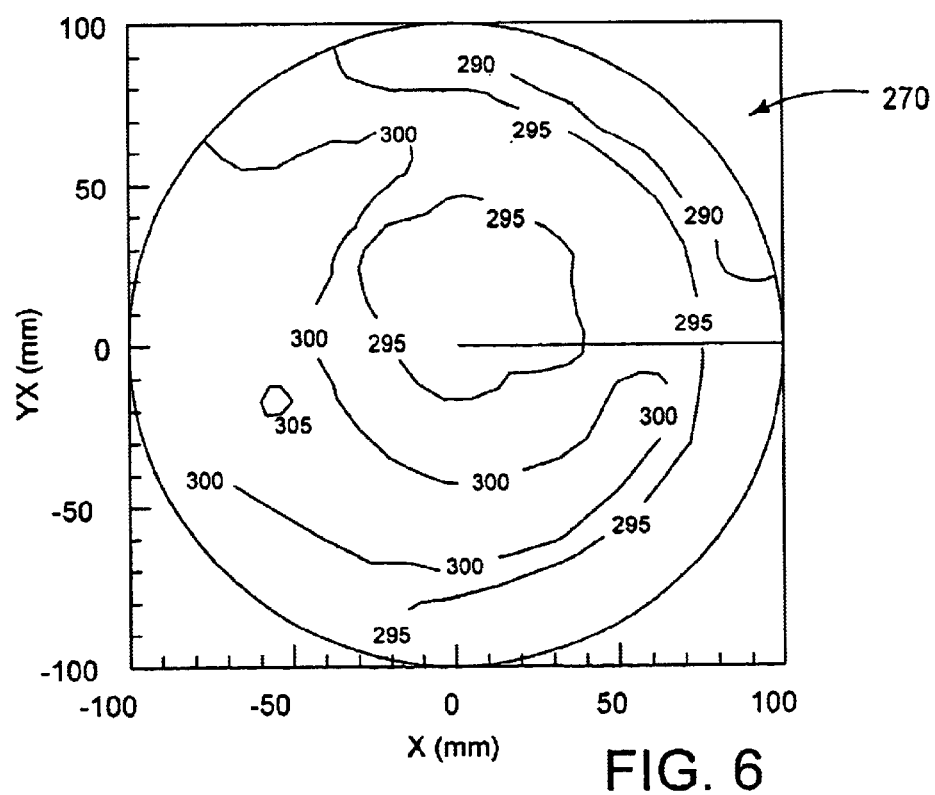
FIG. 6 shows a contour plot illustrating the improved etch rate uniformity resulting from the antenna arrangement shown in FIGS. 2 and 4.

FIG. 6 shows a contour plot 270 of the etch rate as a function of position over the surface of a wafer processed using the same process as that used in the process corresponding to Figure 260, but using a plasma processing device having the antenna arrangement as shown in FIGS. 2 and 4. The top center of the plot corresponds to the position of the RF antenna feed, and the center of the plot corresponds to the central axis 245 of the plasma processing device. The contour labels indicate the etch rate in units of Angstroms per minute. As can be seen, the etch rate is the highest in a sector toward the left of the plot and the lowest in a sector toward the top right of the plot. However, the mean etch rate over the surface of the wafer is 29.7 nm/min, which is comparable to the prior art process, but with a standard deviation of 0.5 nm/min and a range of 1.8 nm/min: i.e. the uniformity of the etch rate has been doubled and the variation in the etch rate with angle has been decreased. Therefore the etch rate using the antenna arrangement of the present invention has a greater uniformity and azimuthal symmetry than that of the prior art.

Without wishing to be bound by theory, a factor is believed to be the passive antennae modifying the rf field distribution in the plasma generating region to increase the azimuthal symmetry of the rf field distribution in the plasma generating region. Another factor would be important if the rf antenna and wafer are not co-axially aligned. In this case, no matter how symmetric the rf field distribution produced by the rf antenna alone, there would likely be significant variations in the etching rate over the wafer surface. The passive antennae are then used to modify the rf field distribution within the plasma chamber, and indeed may actually reduce the symmetry of the rf antenna rf field distribution within the plasma chamber, but actually increase the uniformity of the processing rate over the wafer surface, by generating an rf field distribution which increases the etch rate at areas of low etch rate, and vice versa, over the wafer surface.

Figure 7:
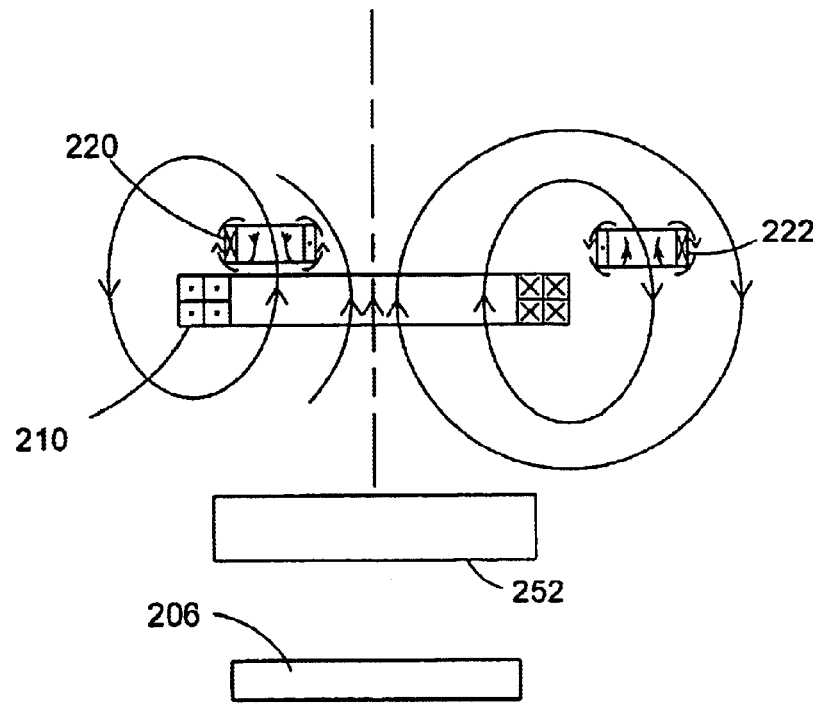
FIG. 7 shows a schematic cross sectional diagram of the antenna arrangement of FIGS. 2 and 4 and the effect of the passive antennae on the magnetic field pattern at an instance in the rf cycle.

FIG. 7 shows a schematic cross section of the rf antenna 210, first 220 and second 222 passive antennae, plasma generating region 252 and wafer 206 along line AA' of FIG. 4. FIG. 7 also shows the instantaneous current and magnetic field distribution of the antenna arrangement. At the illustrated instance in the rf cycle, the rf current in the rf antenna is entering the right hand side of the rf antenna (passing into the page) and exiting the left hand side of the rf antenna (passing out of the page). This current results in the magnetic field pattern shown in solid lines.

The first passive antenna 220 links magnetic flux of the rf antenna magnetic field and, according to Lenz's law, a current is induced in the passive antenna which generates a passive antenna magnetic field, shown in dashed lines, opposite in sense to the rf antenna magnetic field within the passive antenna. Hence the net magnetic field over the area of the passive antenna is reduced. In this example, the passive antenna magnetic field may be in the same direction as the rf antenna magnetic field in regions outside the area of the passive antenna so that the net magnetic field may be increased. In practice, as the material of the passive antenna is not a perfect conductor, the magnetic field within the passive antenna is not perfectly cancelled out. The effect of the first passive antenna 220 is that the magnetic field at the position of the passive antenna within the rf antenna is reduced thereby also changing the rf field distribution within the processing chamber and over the plasma generating region 252. It should be understood that since the magnetic field from the rf antenna is an rf magnetic field, the magnetic field produced by the passive antenna is also an rf magnetic field.

The second passive antenna 222 also links magnetic flux of the rf antenna magnetic field and, according to Lenz's law, a current is induced in the passive antenna 222 which generates a passive antenna rf magnetic field, shown in dashed lines, opposite in sense to the rf antenna magnetic field within the passive antenna. Hence the net magnetic field over the area of the passive antenna is reduced. In practice, as the material of the passive antenna is not a perfect conductor, the magnetic field within the passive antenna is not perfectly cancelled out. The effect of the second passive antenna 220 is that the magnetic field at the position of the passive antenna outside the RF antenna is reduced thereby also changing the rf field distribution within the chamber and over the plasma generating region 252. As shown by FIG. 6, the net effect of the two passive antennae is to increase the uniformity of the etch rate over the wafer surface.

As discussed above there may be a number of contributing factors to process non-uniformity which can be reduced using the passive antennae. The passive antennae may be used to increase the symmetry (e.g. the azimuthal symmetry) of the rf field distribution in the plasma generating region. The passive antennae may be used to modify the rf field distribution in the processing chamber so as to reduce any inherent asymmetries in the rf antenna or the plasma processing device. Also the passive antennae may be used to reduce the symmetry of the rf antenna rf field distribution, if that results in a more uniform processing rate, e.g., because the wafer and rf antenna are misaligned. Also the passive antennae can be used to modify the rf field distribution within the plasma chamber to counteract any effects of elements of the plasma processing chamber on the electromagnetic field distribution, so as to improve the uniformity of plasma processing across the wafer.

As shown in FIGS. 2, 4 and 7 the passive antennae are inductively coupled to the rf antenna by linking the flux of the rf antenna magnetic field. The passive antennae do not require their own power supply. In an alternative embodiment, a one or all of the passive antennae can be placed in electrical contact with the rf antenna. However, even then the antennae are passive antennae as only induced rf currents will flow and not powered rf currents. The passive antennae would be maintained at the same voltage as the rf antenna.

Hence the present invention provides a way of fine tuning or trimming the rf electromagnetic field distribution within a plasma processing device by using appropriately placed and shaped passive antennae to modify the rf field distribution so as to increase the processing uniformity for a wafer.

In light of the above discussion, there are many possible ways of implementing the passive antenna which will depend on a number of factors, including the shape, size and nature of the modification to the rf field distribution that needs to be made, and more practical matters such as the space available within the plasma processing device in which the passive antenna can be placed. The location of the passive antenna relative to the rf antenna will also be a factor, as will the orientation of the passive antenna relative to the rf antenna.

FIGS. 8A–J show example alternative embodiments of the passive antenna. The passive antenna has the structure of an electrically conducting loop providing a low resistance current path so that a reasonable strength magnetic field will be induced by the RF antenna flux linked by the passive antenna. FIGS. 8A–G show perspective views of alternative passive antenna shapes. The passive antenna can have a curved shape, such as a circular shape, a segmental shape, a crescent shape, an oval or ellipsoidal shape. The passive antenna can also have a substantially polygonal shape, such as a square or triangular shape, and can be a regular or irregular polygon. The antenna can have an irregular shape, being made up of linear and curved sections or a combination of both. The passive antennae of FIGS. 8A to G have a substantially flat planar shape. The passive antennae of FIG. 8H has a less planar, 'saddle' shape and the passive antenna of FIG. 8I also has non-flat planar shape. In a further embodiment as illustrated by FIG. 8J, the passive antenna can be a more 3 dimensional body such as a sphere, spheroid, oblate spheroid, prolate spheroid, cube, and higher number of side bodies. The bodies can be regular or irregular and can have a solid surface or can have an aperture or apertures therein.

FIG. 9 shows an alternative embodiment of the antenna arrangement 300 of the present invention. The RF inductive antenna 210 is broadly the same as that described previously. In this arrangement, there is provided a passive antenna 280 in the form of a circular band of silver plated copper and which is located co-axially of the RF antenna. The passive antenna is mounted on a support 500 so that the position of the passive antenna along the central axis 245 of the plasma processing device can be changed.

The support includes an arm 502 which passes through an aperture in a support body 504 and so that the arm can slide along axis 245. A first end of the arm has a handle 506 and a second end of the arm has radially extending mounting elements 508 by which the passive antenna 280 is attached to the support. The mounting elements can be provided with azimuthal symmetry. The support can be non-electrically conducting and can be configured so as not to generate any further substantial electric or magnetic field asymmetries. The support maintains the passive antenna co-axial with the inductive antenna and the handle 506 of the support can be operated to change the position of the passive antenna along the axis 245.

The magnetic field lines of the magnetic field generated by the RF antenna are shown for an instance in the rf cycle with the current distribution illustrated. The passive antenna links magnetic flux of the rf antenna magnetic field and, according to Lenz's law, a current is induced in the passive antenna 280 which generates a magnetic field (partially shown in broken lines) opposing the rf antenna field within the area of the passive antenna. Hence the magnetic field strength in the plasma region 252 toward the center is decreased. However, as shown in FIG. 9, the passive antenna magnetic field acts to increase the magnetic field outside the passive antenna. Therefore the magnetic field strength in the plasma region 252 around the periphery is increased. Hence, locating the circular passive antenna co-axial with the circular RF antenna modifies the radial distribution of the rf field distribution within the plasma chamber and in the plasma generating region 252. Hence the radial rf field distribution can be altered within the plasma generating chamber so as to tune the magnetic field to optimize the plasma processing device for use with different etchants, e.g., argon and chlorine.

Different diameter passive antenna will alter the radial distribution of the electromagnetic field in the plasma generating region. Also moving the passive loop along the central axis 245 will change the rf field distribution. Moving the passive coil away from the rf antenna and plasma region into position 282 (upward as shown in FIG. 9) will change the amount of rf antenna flux that is linked and will also reduce the contribution of the passive antenna field to the rf field distribution within the chamber. Moving the passive coil toward the plasma region 252 to position 284 will also change the RF flux linkage, but will decrease the distance between the passive antenna and chamber, thereby increasing the effect of the passive antenna field on the rf field distribution.

In an alternative embodiment, the passive antenna 286 is outside the RF antenna and surrounds the RF antenna so as to change the radial distribution of the electromagnetic field at the plasma region. Although a circular rf antenna is shown in FIG. 9, the antenna arrangement can include different types of rf antenna such as a spiral antenna or a hemispherical spiral antenna. In other embodiments, the passive antenna can be located non-coaxially with the rf antenna and may or may not be the same shape as the rf antenna. In the example embodiment shown in FIG. 9, moving the passive antenna along the rf antenna axis means that it is substantially the radial component of the rf field distribution that is modified. For different rf antenna and passive antenna geometries and different relative movement of the passive antenna and rf antenna, other components of the rf field distribution will be modified to a greater or lesser extent, as required in order to increase fine tune the processing or increase the uniformity of the processing.

Figure 10:
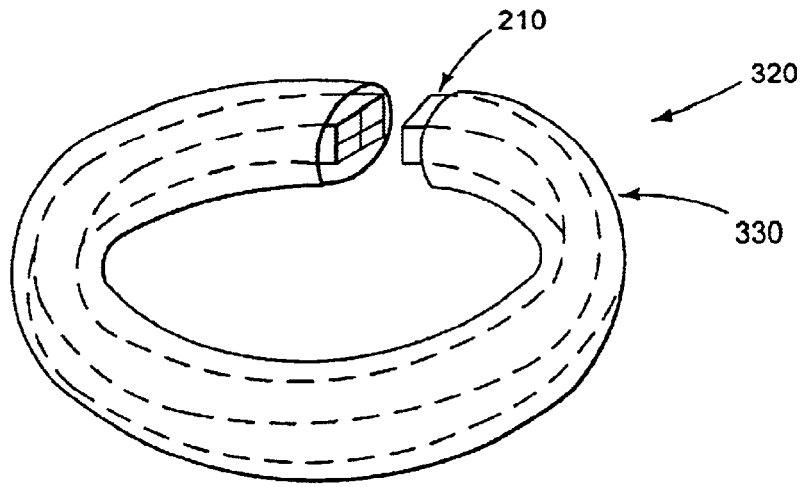
FIG. 10 shows a schematic perspective diagram of an embodiment of the antenna arrangement including a shielding passive antenna.

FIG. 10 shows a schematic perspective drawing of a further embodiment 320 of the antenna arrangement of the invention. In this embodiment, the passive antenna 330 is provided in the form of a shield which encloses the rf antenna 210 and extends along most of the length of the rf antenna, apart from the rf feed part of the rf antenna. In an alternative embodiment, the passive antenna also encloses the rf feed part of the rf antenna. This can be beneficial if the rf feed part of the antenna is a major source of the asymmetry in the rf antenna rf field. The passive antenna 330 has a substantially annular shape. The passive antenna is made from an appropriately shaped sheet of silver plated copper. At least one gap in the passive antenna should be provided, because a shield passive antenna that enclosed the rf antenna along the whole of its length would completely contain rf magnetic field of the antenna, not allowing the rf magnetic field to reach to the plasma generating region. As will be explained in greater detail below, the cross-sectional shape of the passive antenna is the same as the shape of the magnetic field lines of the magnetic field that the rf antenna would generate in the absence of any asymmetries. The surface of the passive antenna is such that it is parallel to the desired symmetric parts of the rf antenna field. The embodiment 320 of the passive antenna shown in FIG. 10 is beneficial in providing maximal screening of some of the asymmetries in the rf antenna field within the constraints of requiring a feed position and a gap to allow the RF antenna magnetic field out.

The passive antenna 330 also acts as a Faraday shield to an extent. The part of the surface of the passive antenna located between the rf antenna and window provides a substantially annular Faraday shield and reduces the capacitive coupling between the rf antenna and the plasma (although there will still be a capacitive component of the rf field distribution within the plasma chamber). However, the shielding passive antenna 330 is configured so as to modify the rf field distribution by removing the undesired asymmetric parts from the inductive field. In contrast conventional Faraday shields are configured so as to pass the inductive part of the rf field without modifying it.

Figure 11:
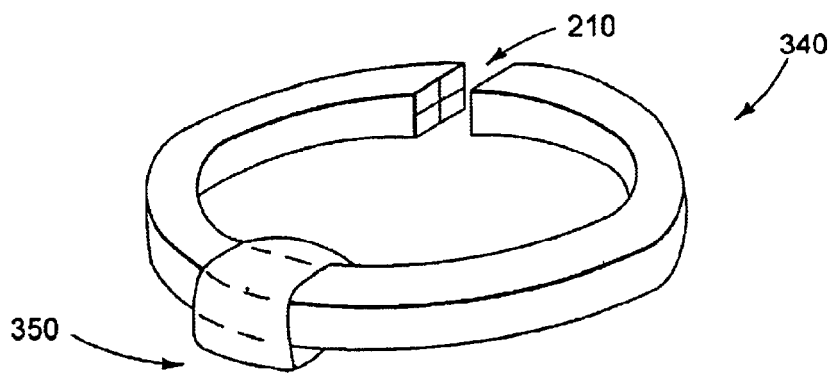
FIG. 11 shows a schematic perspective diagram of a further embodiment of the antenna arrangement including a shielding passive antenna.

FIG. 11 shows a schematic perspective drawing of a further embodiment 340 of the antenna arrangement of the invention. In this embodiment, the passive antenna 350 is provided in the form of a shield which encloses the rf antenna 210 about a part diametric to the feed part of the rf antenna. The passive antenna is made of an appropriately formed sheet of silver plated copper. The passive antenna again has a cross sectional shape which is parallel to the magnetic field lines of the symmetric parts of the rf antenna field so as to shield out the asymmetric parts. As the feed part of the rf antenna is considered to be a major source of the asymmetry of the rf antenna magnetic field pattern, the passive shielding antenna can be located at a position about the rf antenna diametrically opposite the feed part.

Figure 12A:
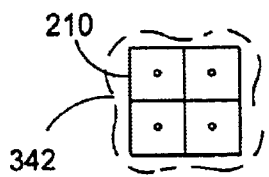
FIGS. 12A, 12B and 12C respectively show schematic cross sectional drawings of the rf antenna and symmetric magnetic field pattern, asymmetric magnetic field pattern, and with a passive antenna shield.
Figure 12B:
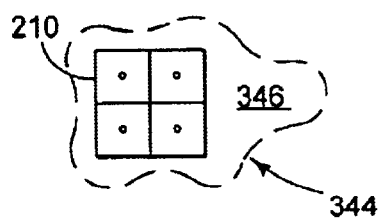
Figure 12C:
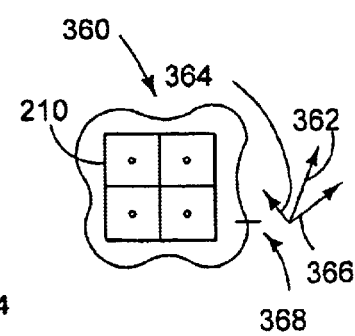

The principle of operation of the shielding aspect of the passive antenna will now be described with reference to FIGS. 12A–C and 13. FIGS. 12A to 12C show cross sectional drawings of the RF antenna 210. FIG. 12A shows a magnetic field line 342 at an instance of the RF cycle for the perfectly symmetric RF antenna. FIG. 12B shows a magnetic field line 344 at an instance of the RF cycle for an asymmetric RF antenna, in which a lobe 346 representing the asymmetric part of the field pattern has been added to the perfect field pattern shown in FIG. 12A. FIG. 12C shows a shielding passive antenna 360 having the same cross sectional shape as the symmetric RF antenna field pattern. The surface of the passive antenna is parallel to the magnetic field line 344 of the magnetic field at every position except the lobe part.

Figure 13:
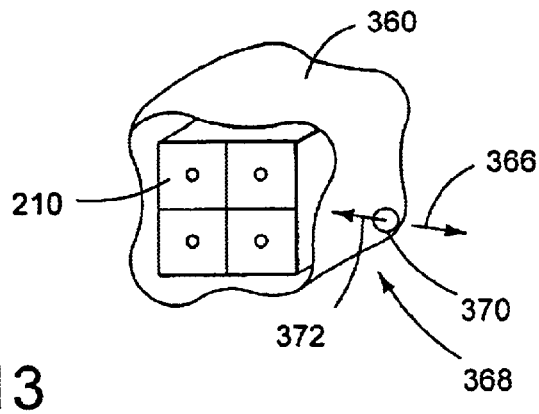
FIG. 13 shows a perspective view of the antenna arrangement shown in FIG. 12C illustrating the effect of the passive antenna.

Every part of the magnetic field in the lobe part 362 can be decomposed into a component which is parallel 364 to the symmetric field line 342 and a component that is perpendicular 366 to the symmetric field line 342. As the passive antenna surface is parallel to the symmetric field, it will be at all places parallel to the component parallel to the symmetric field and at all places present a surface normal to any perpendicular component. As illustrated in FIG. 13, at a position 368 on the passive antenna, the perpendicular component will, according to Lenz's law, induce a surface current 370 in the passive antenna, which generates a magnetic field 372 to cancel the perpendicular component. Hence, the passive antenna 360 inductively couples with the magnetic field of the rf antenna and surface currents are induced which cancel the non-symmetric part of the rf antenna field at everywhere on the surface of the passive antenna. Hence the symmetry of the rf antenna field is increased thereby increasing the symmetry of the electromagnetic field in the plasma generating region.

Figures 14, 15:
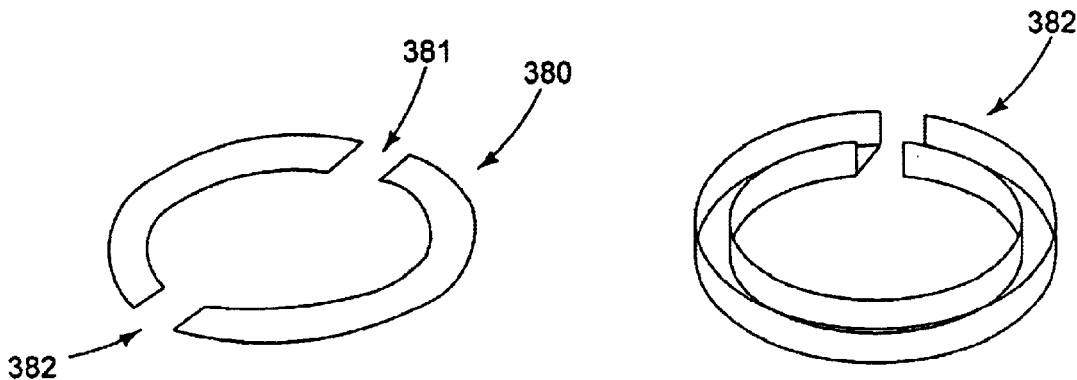
FIG. 14 shows a schematic perspective view of an alternate embodiment of a passive antenna.
FIG. 15 shows a schematic perspective view of a further alternate embodiment of a passive antenna.

FIGS. 14 to 17 show alternate embodiments of the shielding inductively coupled passive antenna. The passive antenna 380 shown in FIG. 14 is in the form of a substantially circular, annular plate, made of silver plated copper having a first gap 381 and a second gap 383. The width of the annular part of the plate is less than the radius of the inner diameter of the annular plate. Using two gaps increases the efficacy of the Farday shielding aspect of the passive antenna. Two gaps reduces the potential difference between adjacent ends of the annular shield, compared to the case of a single gap. More than two gaps can be used. The shape of the passive antenna is configured so as to modify the inductive part of the rf field distribution by allowing surface currents to be induced to remove unwanted asymmetric parts of the rf antenna field. In use such a shielding antenna would be located concentric with and above or below the RF antenna. The passive antenna will provide no Faraday shielding effect when not disposed at least partially between the rf antenna and plasma. This passive antenna can shield out those asymmetric components of the RF antenna magnetic field perpendicular to its surface. Although appearing superficially similar to a conventional Faraday shield, the passive antenna 380 can be distinguished as being configured so as to produce a current path allowing surface currents to be induced in its surface so as to cancel out undesired inductive parts of the rf antenna field. In contrast, a Faraday shield is configured specifically to pass the inductive part of the rf field unchanged.

FIG. 15 shows a passive antenna 382 in the form of an annular, three-sided rectangular trough so as to shield out those unwanted inductive parts of the rf antenna field from the sides and below. A curved trough, e.g., U or C shaped in cross section could also be used, as appropriate and depending in the shape of the RF antenna magnetic field pattern that it is necessary to match. Also, more than one gap can be provided in the passive antenna to improve its Faraday shielding performance. Other embodiments of the shielding passive antenna can include an inner wall, an outer wall, a top wall or a side wall of the shield, or any combination thereof, with as many gaps as are appropriate for the application.

Figures 16, 17:
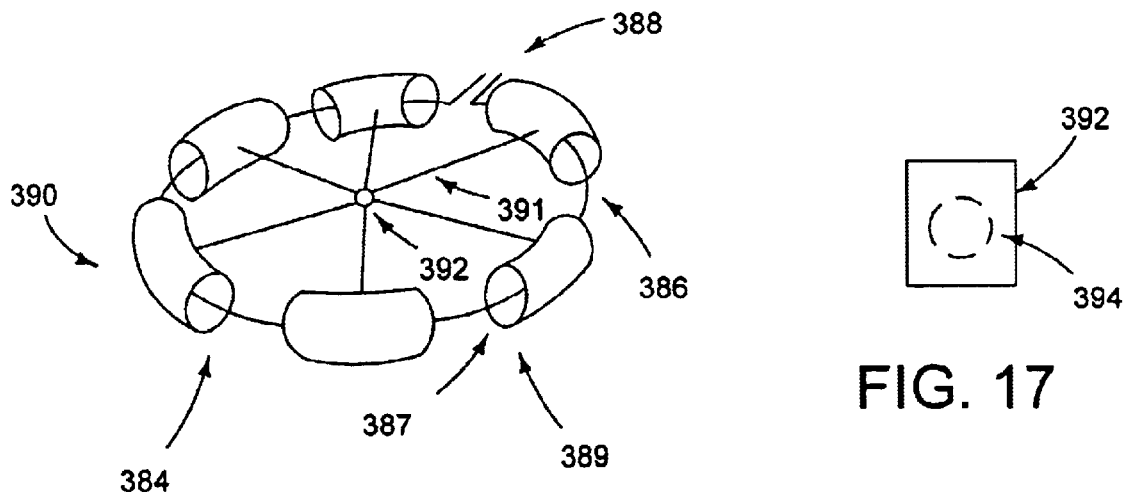
FIG. 16 shows a schematic perspective view of a yet further alternate embodiment of a passive antenna.
FIG. 17 shows a schematic perspective view of a yet further alternate embodiment of a passive antenna.

FIG. 16 shows a further alternative embodiment 384 of the antenna arrangement. In this embodiment, the rf inductive antenna 386 is shown as a simple wire loop having an rf feed point 388. In the absence of the rf feed and any other azimuthal symmetry introducing means, the wire loop would have a poloidal magnetic field pattern. The passive antenna 390 is provided in the form of six metal, curved cylinder-like sections, each enclosing a section of the rf antenna. The sections each have a respective radially extending metal limb 391 by which they are connected at a central hub 392. This improves the Faraday shielding effect of the passive antenna 390. Each of the sections has approximately the same length and the spacing between sections is approximately the same. Hence, each section and gap extends over an angle of approximately 30°, and the sections are equiangularly regularly spaced about the rf antenna. In this way the passive antenna is made to be as azimuthally symmetric as possible, thereby helping to reduce introduction of any azimuthal asymmetries by the passive antenna. Also, providing the passive antenna along substantially the whole of the length of the RF antenna helps to reduce large scale asymmetries in the azimuthal symmetry in the plasma region, while small scale diffusion of the plasma helps to increase the overall azimuthal symmetry of the plasma itself. The fine scale positioning of the sections may not be perfectly azimuthally symmetric so as to help counteract the effect of the location of the antenna feed. Further, in another embodiment there may be an odd number of sections such that a section, rather than a gap, is diametrically opposed to the location of the feed.

Each of the sections of the shielding passive antenna 390 to some extent acts as a perturbation on the magnetic field that the rf antenna generates. The perturbing effect of the shielding antenna sections can be reduced by making the cross sectional shape of the edges of the ends of each section the same as the magnetic field lines of the rf antenna magnetic field would have at the gap regions between the sections in the absence of the passive antenna. For example, the natural, symmetric magnetic field for the circular rf antenna, in the absence of the shielding antenna 390, would be a poloidal field having a circular cross section in the plane perpendicular to the wire of the wire loop rf antenna 386. Therefore, the perturbing effect of the shielding antenna sections can be reduced by making the cross sectional shape of the edge 387, of each end part 389 of the sections circular also. This helps to smooth the transition between the shielding sections and the gaps in the passive antenna.

Although the cross section of the passive antenna sections in FIG. 16 is shown as the same along the length of each section, it can be appropriate for the cross sectional shape of the passive antenna to vary along its length along the rf antenna. However, making the cross sectional shape of the edges of the ends of the passive antenna the same as the magnetic field lines that the rf antenna magnetic field would have in the absence of the passive antenna, can help to reduce the perturbing effect of the passive antenna on the rf field distribution.

FIG. 17 shows the simplest embodiment of the shielding passive antenna 392. In this embodiment, the passive antenna is provided in the form of a substantially planar, rectangular sheet of silver plated copper. The sheet provides a surface current path 394, so that when the sheet is located adjacent the rf antenna, it can inductively couple to the rf antenna field, and a canceling field will be generated to reduce an asymmetric part of the rf antenna field and modify the rf field distribution in the plasma chamber in such a way as to increase the processing uniformity.

Figure 18:
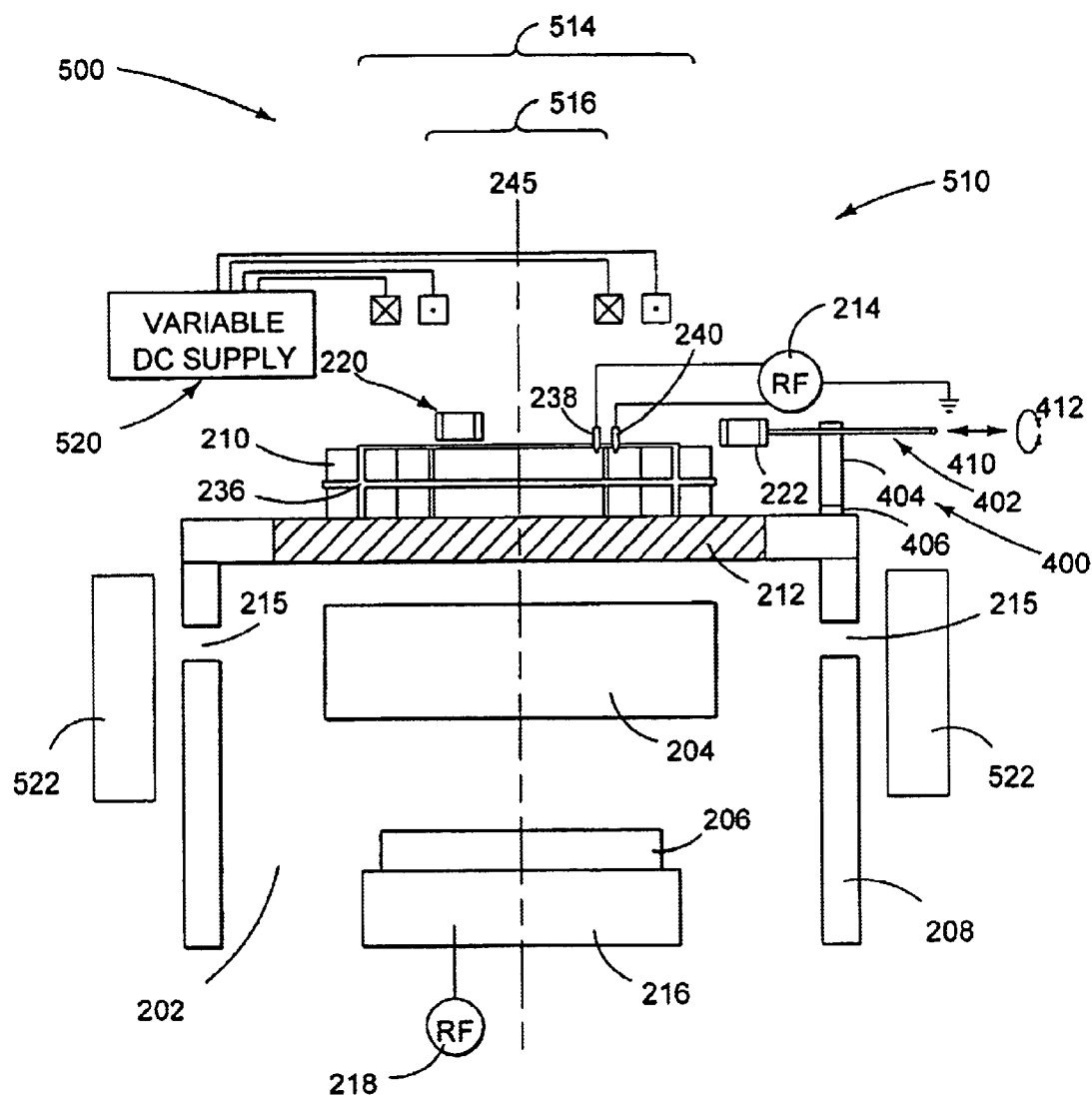
FIG. 18 shows a shows a schematic cross sectional drawing of a plasma processing device similar to that of FIG. 2 and including a further embodiment of a modified antenna arrangement according to the present invention.

FIG. 18 shows a schematic cross sectional view of a plasma processing apparatus 500 similar to that shown in FIG. 2, and having an additional electromagnet arrangement 510 The electromagnet arrangement includes a first outer circular coil 514 and a second inner circular coil 516 concentric to the plasma chamber. Each coil is connected to a variable supply of DC electrical power 520 which supplies a DC current to each coil and which flows in opposite directions in each coil. Plasma processing apparatus 500 also includes a magnetic bucket arrangement 522, which includes a plurality of permanent magnets axially oriented around the periphery of the plasma processing chamber. The magnetic bucket arrangement is configured to provide a permanent DC magnetic field which keeps the plasma current density gradient away from the wafer 206 while simultaneously maintaining a very small magnetic field at the wafer 206. The magnetic bucket arrangement helps to reduce plasma loss to the wall of the plasma processing chamber. In one embodiment, the magnetic bucket arrangement includes thirty two permanent magnet cusps that have their radial magnetization factors alternating around the chamber (e.g., N, S, N, S etc.). However, the actual number of cusps may vary according to the specific design of each plasma processing system.

The electromagnetic coil arrangement is configured to provide a DC magnetic field having a controllable radial variation within the plasma processing chamber in the region proximate the window 212. The radial variation in the DC magnetic field is made by varying at least one of the DC currents flowing in at least one of the coils. The radial variation in the DC magnetic field is effective to affect the processing uniformity across the wafer 206. The DC magnetic field can be constant or can be allowed to vary slowly with time, if required to match variations in processing. The electromagnetic arrangement, magnetic bucket arrangement and other embodiments thereof are described in greater detail in U.S. Pat. No. 6,341,574, issued on Jan. 29, 2002, entitled "Plasma Processing System", by Bailey, III et al., the contents of which are hereby incorporated by reference.

The DC magnetic field distribution provided by the coil arrangement and bucket arrangement, together or separately, helps to prevent lateral diffusion of the plasma species and so helps to both confine the plasma and also collimate the plasma species, so as to enhance their transport toward the wafer surface. In the absence of the DC field, lateral plasma diffusion tends to wash out or reduce asymmetries in the plasma generating region by time the plasma reaches the wafer. As the DC magnetic field helps to retain the plasma species at the wafer surface in a similar configuration to that of the plasma, any non-uniformities in the plasma distribution will be more evident at the wafer surface. Therefore the effect on etching uniformity of any asymmetries in the plasma distribution is enhanced at the wafer surface by the use of a DC magnetic field provided by the DC electromagnets arrangement 510 or the bucket arrangement 522 or both. However, by using the passive antennae, asymmetries in the plasma distribution can be reduced, such that the benefits of using the DC magnetic field to increase the transport of plasma species to the wafer surface can be realized without significantly reducing the etching uniformity. As the effect on the wafer of the rf antenna asymmetries is larger when the DC magnetic fields are present, the benefit from eliminating the asymmetries using passive antennae can be larger when the DC magnetic fields are present.

From another view point, in the absence of the plasma species collimating effect of the DC magnetic fields, lateral plasma species diffusion can increase the uniformity of etching on the wafer surface. The reduction of lateral diffusion by the DC magnetic fields means that the improved uniformity of the plasma caused by the passive antenna is more usefully propagated to the wafer surface to provide uniform etching. Hence, the use of a constant or slowly time varying DC magnetic fields provided by the permanent bucket magnets and/or electromagnet arrangement enhances the effect of the passive antennae on the uniformity of etching that can be achieved.

Figure 19:
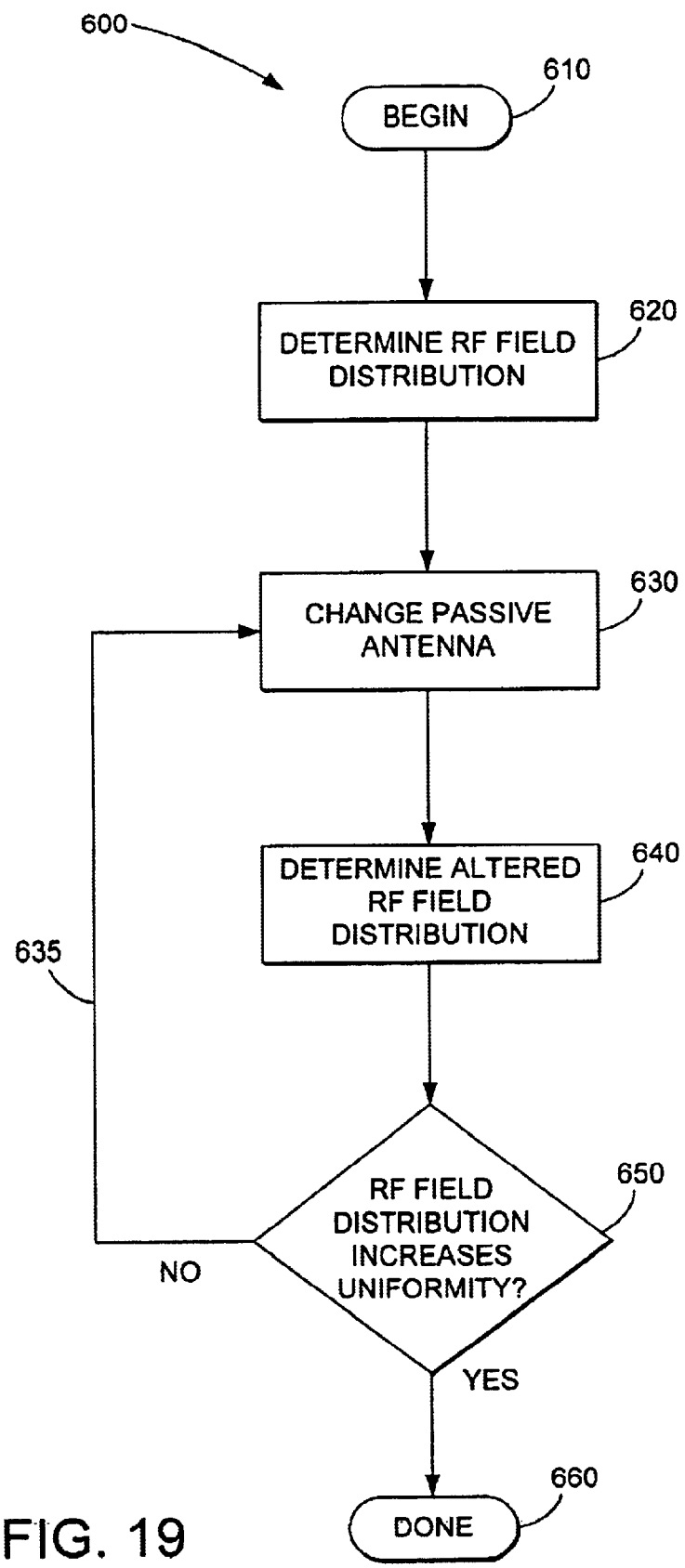
FIG. 19 shows a flow chart illustrating an rf electromagnetic field distribution tuning method according to the present invention.

FIG. 19 shows a flow chart 600 illustrating a method for tuning the rf field distribution that is provided in a plasma chamber. In general terms, at the beginning of the method 610, the first step is to determine 620 the rf field distribution that results from the rf antenna. In a second step, a passive antenna is added 630 to the rf antenna and inductively coupled to the rf antenna. Then in step 640, the altered rf field distribution arising as a result of the interaction between the passive antenna and the rf antenna is determined. If the resulting rf field distribution is determined 650 by a criterion to result in an increased processing uniformity, then the method can terminate at step 600.

Alternatively, if the passive antenna is determined at step 650 either not to result in increased processing uniformity or for the increase in processing uniformity not to meet a criterion, then in a branching step 635 a passive antenna can be 'added' 630 by either adding further passive antenna or antennae, or the original passive antenna can be replaced by a different passive antenna, or the original passive antenna can be reconfigured, for example, by repositioning it with respect to the rf antenna. The new altered rf field distribution is then re-determined 640 and the increase in processing uniformity re-determined 650. The steps of adding passive antennae and re-determining the rf field distribution can be iterated as many times as are required until a selected processing uniformity metric or threshold has been achieved.

Alternative example embodiments of the tuning method 600 will now be described in greater detail.

In one embodiment, the tuning method can be computational and can be directed at increasing the symmetry of the rf field generated by the rf antenna and passive antenna, or antennae, at the plasma generating region in the plasma chamber or otherwise to alter the rf field distribution in the plasma processing device so as to increase the processing uniformity. The determination of the rf field distribution can be carried out using a computer and suitable electromagnetic field modeling software. An example of a commercially available software package would be Maxwell 3$d$ as provided by Ansoft Corp. Given the shape of the rf antenna and certain boundary conditions the various components of the vector rf field in space around the antenna can be calculated. The shape of the antenna can be varied and various passive antennae can be added into the calculation so as to optimize to obtain the most uniform resulting rf fields for certain restrictions, such as a minimal antenna part separation to prevent arcing.

Figure 20A:
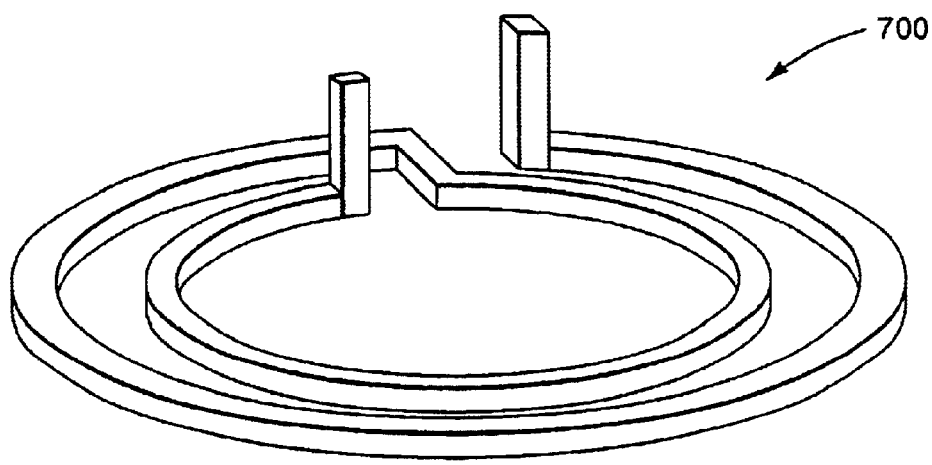
FIGS. 20A, B & C show schematic drawings of conceptual parts of an rf antenna illustrating the sources of symmetric and non-symmetric rf fields.
Figure 20B:
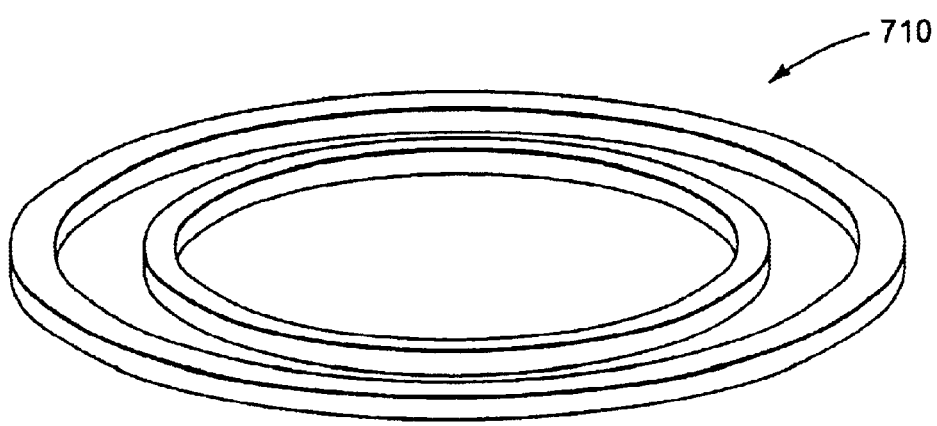
Figure 20C:
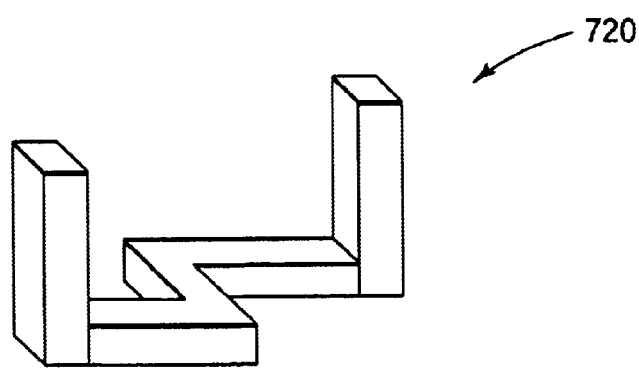

As illustrated in FIGS. 20A, B & C, an actual rf antenna 700, can be conceptualized as perfectly symmetric rf antenna 710 and a perturbing part 720 representing the rf antenna feeds and cross over parts. The objective is to provide a passive antenna which reduces the contribution of the perturbing part 720 to the rf field distribution while minimizing effect of the passive antenna on the rf field distribution provided by the symmetric part 710. The ideal solution would be a passive antenna with the same shape as part 720 and with an equal and opposite phase rf current flowing in it. However, the passive antenna cannot occupy the same physical space as the physical feed and cross over parts. Initially the rf field distribution is calculated 620 for the powered rf antenna alone, taking into account the rf feeds, any missing segments and other sources of asymmetry, and in the absence of any passive antennae.

Then one or more passive antennae are introduced 630 and the rf field distribution is calculated again 640 and the affect on processing uniformity assessed 650. Different passive antennae configurations can be provided and the rf field distributions re-calculated 635, until a preferred passive antenna or antennae configuration is arrived at which gives the most symmetric calculated rf field distribution, or the rf field distribution otherwise providing increased processing uniformity, e.g. if it is known that there is a particular source of processing non-uniformity in the plasma processing device that the rf field distribution is to be changed to correct for. The computationally derived passive antennae can then be realized and implemented.

In another embodiment of the method the rf field distribution of an rf antenna and rf antenna and passive antenna configuration is measured using an electromagnetic field measuring device. The rf antenna is placed in an etch chamber or put in an rf test stand and powered using a low voltage signal. The vector rf field distribution in space around the rf antenna, in the absence of any passive antennae, is measured using an rf pick-up probe to determine 620 the rf field distribution. A suitable rf pick-up probe can comprise a short section of rigid coaxial conductor bent into a single loop and with the inner conductor shorted to the outer conductor. One or more passive antennae are added 630 to the rf antenna and the resulting rf field distribution is again measured using an rf probe to determine the altered rf field distribution 640. It is determined 650 if the measured rf field distribution meets a processing uniformity criterion or criteria, such as a particular degree of symmetry, and if not 635 then other passive antenna configurations are assembled and their rf field distributions measured. Passive antenna numbers, positions, orientations, shapes and other properties affecting the rf field they generate may be varied in order to provide an optimized processing uniformity.

When a suitable rf antenna and passive antenna configuration has been derived, the rf antenna and passive antenna can be installed in a plasma etching device and their relative positions fixed so that further measurements or testing can be carried out or plasma processing can be carried out directly.

In another embodiment of the processing uniformity tuning method 600, work piece processing is used to help determine the rf field distributions. A wafer is used as a work piece and is located in a plasma processing tool. An etch is carried out using an rf antenna and no passive antennae, and the process uniformity across the wafer is measured and quantified, for example by measuring the etch rate over the surface of a wafer. The etch uniformity is related to the rf field distribution within the plasma chamber and so a measure of the rf field distribution is determined by this step 620. A passive antenna is then added to the rf antenna 630 and another work piece wafer is etched under the otherwise identical processing conditions and the processed wafer is measured and degree of etching over the wafer surface quantified. The difference between the rf antenna alone and the rf antenna and passive antenna processing is then obtained to give a measure of the effect of the passive antenna on the etching uniformity. For example, a passive antenna at a first angular position of the rf antenna may increase the etch rate at the corresponding angular position on the wafer. The passive antenna can then be replaced by a differently shaped or sized passive antenna, or the position or orientation of the passive antenna varied or further passive antennae can be added 630 and then another etch carried out on a new wafer to determine 640 the processing uniformity for that configuration. The effect of the new rf antenna and passive antenna configuration on the rf field distribution and hence processing uniformity can then be assessed by comparing the etching uniformity with that for the rf antenna alone. These steps can be repeated 635 many times with various rf antenna and passive antenna configurations.

The correction required to provide optimal uniformity can be determined from the difference between the rf antenna alone etching pattern and an entirely uniform etching pattern. The combination of passive antennae and rf antenna sufficiently closely matching that difference will provide the optimal uniformity based on the antenna configurations measured so far. If generic relationships are identified, such as increases in passive antenna size or distance from the rf antenna having reasonably fixed relationships to their effect on the processing rate, then reasonably accurate estimates as to the appropriate passive antenna size and position can be made based on the measured results. For example doubling the area enclosed by a passive antenna may increase the change in etch rate at the wafer in a predictable manner. When it is determined that the rf antenna and passive antennae configuration provides processing uniformity, within an acceptable range, then the tool has been tuned for work piece processing proper and the method ends 660. Alternatively further iterations and fine tuning can be carried out using the thus far optimized rf antenna and passive antennae configuration.

Tuning the rf field distribution using this later method is believed to be particularly useful as it is believed that after major sources of non-uniformity have been removed, the sources of processing non-uniformity in otherwise identical processing tools vary substantially randomly from tool to tool. Therefore fine tuning of each processing tool on a tool by tool basis to achieve increased processing uniformity can be carried out to determine the rf antenna and passive antenna configuration that is optimal for each tool.

A number of the features of the various embodiments described can be combined with features of other embodiments so as to provide an antenna arrangement according to the invention. Accordingly, the invention is not considered to be limited to the specific examples shown in the figures only.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and there full scope of equivalents.

What is claimed is:

1. An antenna arrangement for generating an rf field distribution at a plasma generating region inside a chamber wall of a process chamber of a plasma processing apparatus, comprising:

an rf inductive antenna to which an rf power supply is connected to supply an rf current to generate a first rf field extending into the plasma generating region; and a passive antenna, the passive antenna being inductively coupled to the rf inductive antenna and configured to generate a second rf field modifying the first rf field such that the rf field distribution at the plasma generating region increases the processing uniformity of the processing apparatus compared to that in the absence of the passive antenna, wherein the second rf field modifies the first rf field such that the rf field distribution at the plasma generating region has a different symmetry than that in the absence of the passive antenna.

2. The antenna arrangement of claim 1, wherein the passive antenna changes the azimuthal symmetry of the rf field distribution at the plasma generating region.

3. The antenna arrangement of claim 2, wherein the azimuthal symmetry of the rf field distribution is increased compared to that in the absence of the passive antenna.

4. The antenna arrangement of claim 1, and including a plurality of passive antennae, each antenna inductively coupled to the rf inductive antenna and configured to generate a respective rf field further modifying the first rf field such that the rf field distribution at the plasma generating region increases the processing uniformity of the processing apparatus compared to that in the absence of the passive antennae.

5. An antenna arrangement for generating an rf field distribution at a plasma generating region inside a chamber wall of a process chamber of a plasma processing apparatus, comprising:

an rf inductive antenna to which an rf power supply is connected to supply an rf current to generate a first rf field extending into the plasma generating region; and a passive antenna, the passive antenna being inductively coupled to the rf inductive antenna and configured to generate a second rf field modifying the first rf field such that the rf field distribution at the plasma generating region increases the processing uniformity of the processing apparatus compared to that in the absence of the passive antenna, wherein the passive antenna provides an electrically conducting path over which an induced electrical current flows to generate at least a part of the second rf field.

6. The antenna arrangement of claim 5, wherein the passive antenna extends along at least a part of the length of the inductive antenna.

7. The antenna arrangement of claim 5, wherein the passive antenna has a channel shape which extends at least partially around a part of the inductive antenna.

8. The antenna arrangement of claim 5, wherein the passive antenna encloses a part of the inductive antenna.

9. The antenna arrangement of claim 8, wherein the passive antenna encloses the inductive antenna along substantially all of the length of the inductive antenna.

10. The antenna arrangement of claim 5, wherein the passive antenna has a cross-sectional shape substantially matching the shape of the magnetic field lines that the first rf field would have at the location of the passive antenna in the absence of any imperfections in the symmetry of the first rf field.

11. The antenna arrangement of claim 5, wherein the passive antenna has an end region with an edge and the edge of the end region of the passive antenna has a cross-sectional shape substantially matching the shape of the magnetic field lines that the first rf field would have at the location of the edge of the end region of the passive antenna in the absence of the passive antenna.

12. The antenna arrangement of claim 8, further comprising a plurality of passive antennae wherein the passive antenna and plurality of passive antennae are angularly disposed around the rf inductive antenna.

13. The antenna arrangement of claim 12, wherein the passive antenna and plurality of passive antennae are substantially equi-angularly disposed around the inductive antenna.

14. An antenna arrangement for generating an rf field distribution at a plasma generating region inside a chamber wall of a process chamber of a plasma processing apparatus, comprising:

an rf inductive antenna to which an rf power supply is connected to supply an rf current to generate a first rf field extending into the plasma generating region;

a passive antenna, the passive antenna being inductively coupled to the rf inductive antenna and configured to generate a second rf field modifying the first rf field such that the rf field distribution at the plasma generating region increases the processing uniformity of the processing apparatus compared to that in the absence of the passive antenna; and an electromagnet arrangement which generates a DC magnetic field within the process chamber.

15. In a plasma processing device having a process chamber with a chamber wall and an antenna arrangement for generating an rf field distribution at a plasma generating region inside the process chamber, the antenna arrangement comprising an rf inductive antenna connected to an rf power supply to supply an rf current to generate a first rf field extending into the plasma generating region and a passive antenna configured to generate a second rf field, a method for improving plasma processing uniformity comprising the steps of:

inductively coupling the passive antenna and the rf inductive antenna; and positioning the passive antenna to cause the second rf field to modify the first rf field such that the rf field distribution at the plasma generating region increases the processing uniformity of the processing apparatus compared to that in the absence of the passive antenna; and applying a DC magnetic field.

16. The method of claim 15, wherein the DC magnetic field is applied by an electromagnet and the DC magnetic field has a radial variation which is effective to affect plasma processing uniformity.

17. The method of claim 15, wherein the DC magnetic field is applied by a permanent magnet magnetic bucket.

18. A method for tuning the rf field distribution of an rf antenna for use in a plasma processing device, comprising the steps of:

(a) determining the rf field distribution of the rf antenna;

(b) providing at least one passive antenna inductively coupled to the rf antenna;

(c) determining the effect of the passive antenna on the rf field distribution; and (d) iterating steps (b) and (c).

19. The method of claim 18, wherein repeating step (b) includes adding a further passive antenna.

20. The method of claim 18, wherein repeating step (b) includes reconfiguring the passive antenna.

21. The method of claim 20, wherein reconfiguring the passive antenna comprises a reconfiguring step selected from the group comprising: changing the passive antenna position; changing the passive antenna orientation; changing the passive antenna size; changing the passive antenna shape; and changing the passive antenna material.

22. A method for tuning the rf field distribution of an rf antenna for use in a plasma processing device, comprising the steps of:

(a) determining the rf field distribution of the rf antenna;

(b) providing at least one passive antenna inductively coupled to the rf antenna; and (c) determining the effect of the passive antenna on the rf field distribution, wherein the method is carried out computationally.

23. A method for tuning the rf field distribution of an rf antenna for use in a plasma processing device, comprising the steps of:

(a) determining the rf field distribution of the rf antenna;

(b) providing at least one passive antenna inductively coupled to the rf antenna; and (c) determining the effect of the passive antenna on the rf field distribution, wherein steps (a) and (c) are carried out by measuring the field distribution of the rf antenna using an rf magnetic field sensitive device.

24. A method for tuning the rf field distribution of an rf antenna for use in a plasma processing device, comprising the steps of:

(a) determining the rf field distribution of the rf antenna;

(b) providing at least one passive antenna inductively coupled to the rf antenna; and (c) determining the effect of the passive antenna on the rf field distribution, wherein steps (a) and (c) are carried out by determining the effect of the rf field distribution on plasma processing of a work piece.

25. A method for tuning the rf field distribution of an rf antenna for use in a plasma processing device, comprising the steps of:

(a) determining the rf field distribution of the rf antenna;

(b) providing at least one passive antenna inductively coupled to the rf antenna;

(c) determining the effect of the passive antenna on the rf field distribution; and (d) fixing the position of the passive antenna relative to the rf antenna.

* * * * *